(12) United States Patent
Wan

(10) Patent No.: US 9,117,629 B2
(45) Date of Patent: *Aug. 25, 2015

(54) MULTI-ENERGY ION IMPLANTATION

(71) Applicant: Advanced Ion Beam Technology, Inc., Hsin-Chu (TW)

(72) Inventor: Zhimin Wan, Sunnyvale, CA (US)

(73) Assignee: ADVANCED ION BEAM TECHNOLOGY, INC., Hsin-chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/173,776

(22) Filed: Feb. 5, 2014

(65) Prior Publication Data
US 2014/0151573 A1    Jun. 5, 2014

Related U.S. Application Data

(63) Continuation of application No. 13/692,815, filed on Dec. 3, 2012, now Pat. No. 8,673,753.

(51) Int. Cl.
| | |
|---|---|
| H01L 21/425 | (2006.01) |
| H01J 37/317 | (2006.01) |
| H01L 21/265 | (2006.01) |
| H01J 37/302 | (2006.01) |
| H01L 29/66 | (2006.01) |

(52) U.S. Cl.
CPC ............ *H01J 37/3171* (2013.01); *H01J 37/302* (2013.01); *H01L 21/26513* (2013.01); *H01J 2237/047* (2013.01); *H01J 2237/30472* (2013.01); *H01L 21/26586* (2013.01); *H01L 29/66803* (2013.01)

(58) Field of Classification Search
USPC ......................................................... 438/514
See application file for complete search history.

(56) References Cited

U.S. PATENT DOCUMENTS

| | | |
|---|---|---|
| 5,218,210 A | 6/1993 | McIntyre et al. |
| 6,005,253 A | 12/1999 | Kong |
| 6,229,148 B1 | 5/2001 | Prall et al. |
| 6,833,552 B2 | 12/2004 | Berrian |

(Continued)

FOREIGN PATENT DOCUMENTS

EP    0215626 B1    6/1991

OTHER PUBLICATIONS

Non-Final Office Action received for U.S. Appl. No. 13/692,815, mailed on Jun. 20, 2013, 25 pages.

(Continued)

*Primary Examiner* — Reema Patel
*Assistant Examiner* — Syed Gheyas
(74) *Attorney, Agent, or Firm* — Morrison & Foerster LLP

(57) ABSTRACT

In a multi-energy ion implantation process, an ion implanting system having an ion source, an extraction assembly, and an electrode assembly is used to implant ions into a target. An ion beam having a first energy may be generated using the ion source and the extraction assembly. A first voltage may be applied across the electrode assembly. The ion beam may enter the electrode assembly at the first energy, exit the electrode assembly at a second energy, and implant ions into the target at the second energy. A second voltage may be applied across the electrode assembly. The ion beam may enter the electrode assembly at the first energy, exit the electrode assembly at a third energy, and implants ions into the target at the third energy. The third energy may be different from the second energy.

20 Claims, 2 Drawing Sheets

(56) References Cited

U.S. PATENT DOCUMENTS

2005/0239252 A1* 10/2005 Ahn et al. .................... 438/268
2006/0043316 A1    3/2006 Liebert et al.
2009/0189096 A1*  7/2009 Chen et al. ............... 250/492.21

OTHER PUBLICATIONS

Notice of Allowance received for U.S. Appl. No. 13/692,815, mailed on Oct. 30, 2013, 12 pages.

Kamenitsa et al., "Beam Energy Purity in the Eaton NV-8200P ion Implanter", Nuclear Instruments and Methods in Physics Research Section B: Beam Interactions with Materials and Atoms, vol. 96, 1995, pp. 13-17.

Murakami et al., "Beam Tuning with Continuously Variable Aperture", International Conference on Ion Implantation Technology Proceedings, vol. 1, 1998, pp. 428-431.

\* cited by examiner

MULTI-ENERGY ION IMPLANTATION

BACKGROUND

1. Field

This relates generally to semiconductor processing and, more specifically, to methods for multi-energy ion implantation.

2. Related Art

Ion implantation is an important process in the production of integrated semiconductor devices where dopant ions such as boron, phosphorus, arsenic or the like are implanted into a semiconductor substrate to modify the conductivity of the substrate. Certain applications, such as the doping of semiconductor fin structures in the fabrication of FinFET devices, may require a multi-energy ion implantation process to achieve desirable uniformity and thus desirable device performance. In a multi-energy ion implantation process, an ion implanting system performs a set of implants on a target (e.g., a semiconductor wafer having a semiconductor device formed thereon) where each implant is performed at a different energy.

Conventionally, the implant energy for a multi-energy ion implantation process is controlled by adjusting the ion source and the extraction assembly conditions. For example, the implant energy may be increased by increasing the extraction voltage while increasing the distance between the ion source and the extraction electrode. Additionally, the dopant gas flow rate and the source magnetic field may be adjusted to achieve the desired ion beam current. Adjusting the ion source and extraction assembly conditions optimizes the ion beam current for each implant, thereby extending the life of the ion source. However, changing the ion source and extraction assembly conditions also destabilizes the ion beam where the ion beam requires up to several minutes to re-tune and re-stabilize before it can be used to implant ions into a target. In order to reduce the frequency at which the ion source and extraction assembly conditions are changed, conventional multi-energy ion implantation processes may, for example, implant every target in a production lot at a first energy prior to changing the ion beam to a second energy. Each target in the same production lot may then be implanted at the second energy. However, target handling times are increased because each target is transferred into and out of the ion implanting system for each implant energy. Thus, conventional multi-energy ion implantation suffers from low throughputs and may not be a manufacturable solution for semiconductor device production.

BRIEF SUMMARY

In one exemplary embodiment, an ion implanting system having an ion source, an extraction assembly, and an electrode assembly is used for multi-energy ion implantation into a target. An ion beam having a first energy and a first current may be generated using the ion source and the extraction assembly. A first voltage may be applied across the electrode assembly. The ion beam may enter the electrode assembly at the first energy, exit the electrode assembly at a second energy, and implant ions into the target at the second energy. The second energy may be different from the first energy. A second voltage may be applied across the electrode assembly. The ion beam may enter the electrode assembly at the first energy, exit the electrode assembly at a third energy, and implants ions into the target at the third energy. The third energy may be different from the second energy.

The ion implant system may additionally have a variable aperture to control the implant current. The ion beam may be directed through the variable aperture prior to implanting the target. While applying a first voltage across the electrode assembly, the variable aperture may be set to a first aperture width where ions may be implanted into the target at a second energy and a second current. While applying a second voltage across the electrode assembly, the variable aperture may be set to a second aperture width where implant ions into the target at a third energy and a third current. Adjusting implant energy and implant current using the electrode assembly and the variable aperture obviates the need to adjust the ion source and extraction assembly conditions, and thus reduces ion beam set up times.

DETAILED DESCRIPTION

The following description is presented to enable a person of ordinary skill in the art to make and use the various embodiments. Descriptions of specific systems, devices, methods, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

1. Ion Implanting System

Figure 1:
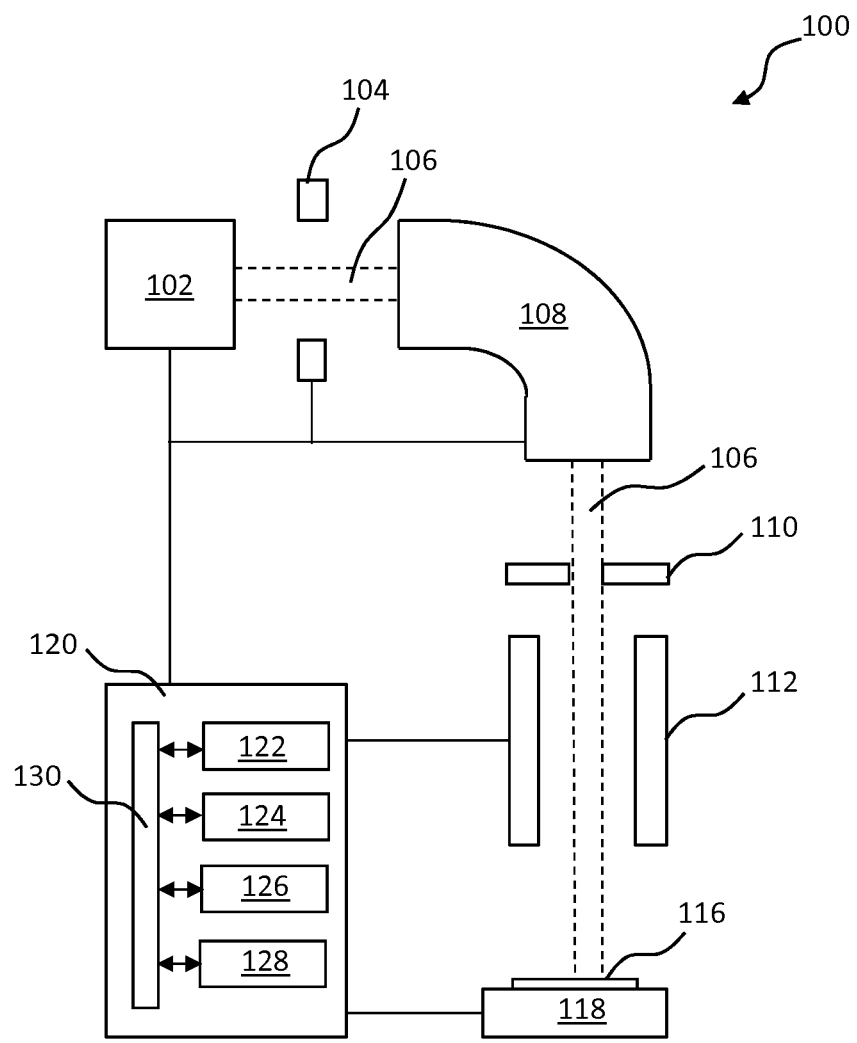
FIG. 1 illustrates an exemplary ion implanting system suitable for performing a multi-energy ion implantation process

FIG. 1 depicts an exemplary ion implanting system 100 suitable for performing a multi-energy ion implantation process on a target 116 in accordance with various embodiments. The system 100 may include an ion source 102, an extraction assembly 104, a mass analyzer 108, and an electrode assembly 112. Ion beam 106 may be generated with ion source 102 and extraction assembly 104. Ion source 102 may be, for example, a Bernas or a Freeman ion source. Ion source 102 may generate desired ion species by the electron ionization of a source gas to form a plasma. For semiconductor device fabrication, the desired ion species may include dopant ion species that comprise of boron, phosphorus, or arsenic, such as, but not limited to B+, P+, and As+. Extraction assembly 104 may include at least one extraction electrode capable of having an extraction voltage applied thereto. An extraction voltage may be applied to the at least one extraction electrode in extraction assembly 104 to extract ions from ion source 102 and generate ion beam 106. The extraction voltage is typically a negative voltage relative to the ion source when generating an ion beam having positive ion species and a positive voltage relative to the ion source when generating an ion beam having negative ion species. Ion beam 106 may be generated at a first energy and at a first current by ion source 102 and extraction assembly 104. The magnitude of the first energy is at least partially determined by the magnitude of the extraction voltage where a larger extraction voltage generates an ion beam having a higher energy. The magnitude of the first current is at least partially determined by the density of the plasma formed in ion source 102 and the magnitude of the extraction voltage where a denser plasma and a larger extraction voltage generates an ion beam having a higher current. The density of the plasma formed in ion source 102 is at least partially determined by the source gas flow rate and the arc current.

Ion beam 106 may be directed into mass analyzer unit 108 as shown in FIG. 1. Mass analyzer unit 108 may apply a magnetic field such that only the ion species in ion beam 106 having the desired mass-to-charge ratio pass through mass analyzer unit 108. Ion beam 106 may pass through a variable aperture 110 before entering electrode assembly 112. Variable aperture 110 may adjust the ion beam current by varying the aperture width through which the ion beam 106 passes. In one example, aperture width may be controlled between 0.1mm and 100mm so that the ion beam current may be varied across a range of up to 3 orders of magnitude. The aperture width of variable aperture may be controlled such that ion beam 106 implants target 116 at a second current where the second current is lower than the first current at which ion beam 106 is generated. A smaller aperture width results in a lower ion beam current while a larger aperture width results in a higher ion beam current implanting target 116. Variable aperture 110 may be disposed either before or after (not shown) electrode assembly 112. When variable aperture 110 is disposed after the electrode assembly, it is closer to target 116 and thus the shape of the ion beam and the ion beam current may be controlled with greater precision. Alternatively, placing variable aperture 110 before electrode assembly 112 reduces particle and energy contamination because electrode assembly 112 may filter out from ion beam 106 contaminant particles and neutral species generated by variable aperture 110. In yet another example (not shown), an ion implanting system may include two variable apertures with the first disposed before and the second disposed after the electrode assembly 112.

In one example, variable aperture 110 may act as a shutter. In such an example, variable aperture 110 may completely close and block ion beam 106, thereby preventing ion beam 106 from implanting ions into target 116. Ion beam 106 may need to be blocked in between implants when the ion beam conditions, such as the extraction voltage or electrode assembly voltage, are changed. Alternatively, ion implanting system 100 may include a separate shutter (not shown) to block ion beam 106.

The energy of the ion beam 106 may remain approximately constant as it travels from extraction assembly 104 to electrode assembly 112. For example, ion beam 106 may enter electrode assembly 112 having an energy that is approximately equal to the first energy at which ion beam 106 is generated. A voltage may be applied across electrode assembly 112 to change the ion beam energy of ion beam 106. In one example, a first voltage may be applied across electrode assembly 112 to either accelerate or decelerate ion beam 106. In such an example, ion beam 106 may enter electrode assembly 112 at the first energy and exit electrode assembly 112 at a second energy. The second energy may be different from the first energy. If the applied first voltage accelerates ion beam 106, then the second energy is higher than the first energy. If the applied first voltage decelerates ion beam 106, then the second energy is lower than the first energy. In another example, a voltage approximately equal to zero may be applied across electrode assembly 112 where ion beam 106 passes through electrode assembly 112 without accelerating or decelerating. In such an example, ion beam 106 may enter electrode assembly 112 at the first energy and exit electrode assembly 112 at approximately the first energy.

Ion beam 106 may pass straight through electrode assembly 112 without being deflected from its original path. Alternatively, electrode assembly 112 may deflect the path of ion beam 106 as it passes through electrode assembly 112. Deflecting the path of the ion beam 106 helps to reduce energy contamination during the implant process. Energy contamination describes the amount of dopant species in the ion beam that are neutral species and have an energy that is different from the desired energy. For example, a first voltage may be applied across electrode assembly 112 such that ion beam 106 enters electrode assembly 112 at 10 keV and exit electrode assembly at 500 eV. While passing through electrode assembly 112, some dopant ions species in ion beam 106 may be neutralized as a result of charge exchange from colliding with residual molecules. In such an example, energy contamination may be defined as the percentage of dopant species in ion beam 106 exiting electrode assembly 112 that are neutral species having an energy greater than 500 eV. The deflection inside electrode assembly 112 effectively blocks and removes almost all neutralized dopant species, thereby reducing energy contamination.

Figure 2:
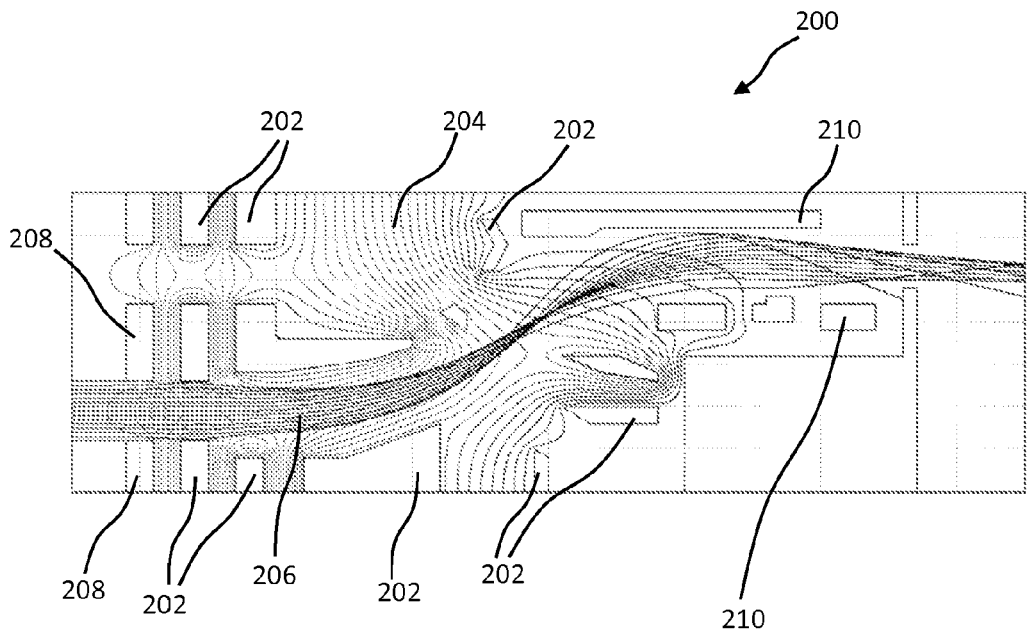
FIG. 2 illustrates an exemplary electrode assembly that may be used in performing a multi-energy ion implantation process.

FIG. 2 depicts an exemplary electrode assembly 200 for accelerating or decelerating an ion beam 206 in an ion implanting system. Electrode assembly 200 may comprise multiple electrodes 202 that include an entrance electrode 208 and an exit electrode 210. Each electrode 202 may be capable of having a voltage applied thereto. The voltages applied to each electrode 202 generate electric fields that are represented by equal potential electric field lines 204 shown in FIG. 2. Ion beam 206 may be manipulated by these electric fields and may thus be deflected, accelerated or decelerated as it travels through electrode assembly 200.

The voltage applied across electrode assembly 200 at least partially determines the net acceleration or deceleration of ion beam 206 through electrode assembly 200. Applying a negative voltage across electrode assembly 200 accelerates an ion beam consisting primarily of negatively charged ion species and decelerates an ion beam consisting primarily of positively charged ion species. Conversely, applying a positive voltage across electrode assembly 200 accelerates an ion beam consisting primarily of positively charged ion species and decelerates an ion beam consisting primarily of negatively charged ion species. A positive voltage is applied across electrode assembly 200 when the voltage applied to entrance electrode 208 is more positive than the voltage applied to exit electrode 210. Similarly, a negative voltage is applied across electrode assembly 200 when the voltage applied to entrance electrode 208 is more negative than the voltage applied to exit electrode. The extent at which ion beam 206 is accelerated or decelerated through electrode assembly 200 is at least partially determined by the magnitude of the voltage applied across electrode assembly 200. The larger the magnitude of the voltage, the greater the extent ion beam 206 is accelerated or decelerated through electrode assembly 200.

Electrodes 202 may be configured to deflect ion beam 206 from its original path as it passes through electrode assembly 200. For example, as shown in FIG. 2, electrodes 202 may deflect ion beam 206 to follow a S-shaped path while it passes through electrode assembly 200. Deflecting ion beam 206 in electrode assembly 200 may help to reduce energy contamination. Energy contamination occurs when neutral species generated in the ion beam are allowed to pass through the electrode assembly. These neutral species are generated by collisions and charge-exchanges due to collisions between the ion species and residual particles as the ion beam travels from the mass analyzer unit to the electrode assembly and through the electrode assembly. The neutral species are not affected by the electric fields in electrode assembly 200 and thus do not accelerate or decelerate through electrode assembly 200. Allowing these neutral species to pass through electrode assembly 200 would result in these neutral species exiting electrode assembly 200 at different energies from the ion species in the ion beam. When implanting a target, the neutral species may implant into the target at a different depth than the ion species and result in an undesired deeper tail in the dopant depth profile. In semiconductor device fabrication, a deep tail in the dopant depth profile would produce deeper junction depths with undesirable electrical characteristics. Deflecting ion beam 206 in electrode assembly 200 helps to filters out neutral species from ion beam 206 because the neutral species are not deflected by the electric fields and thus may be diverted to a neutral beam dump (not shown). In this way, ion beam 106 may pass through electrode assembly 200 with minimal energy contamination.

Referring back to FIG. 1, target 116 may be placed on a holding apparatus 118 in ion implanting system 100. Target 116 may be any target in which ions are desired to be implanted. For example, target 116 may be a semiconductor wafer having a semiconductor structure to be implanted with dopant ions. Target 116 has an implantation surface in which ions are implanted. Holding apparatus 118 may position target 116 in ion beam 106 such that ion beam 106 exiting electrode assembly 112 is incident to the implantation surface of target 116, thereby implanting ions into the implantation surface of target 116. Holding apparatus may provide rotational (tilt and twist) and translational movement of target 116 with respect to ion beam 106. The rotational movement may control the angle of incidence of ion beam 106 to the implantation surface of target 116 and thus the implant angle. The translational movement moves target 116 and permits ion beam 106 to scan across the implantation surface of target 116. The velocity of the translational movement controls the moving velocity of target 116, which at least partially determines the implant dose in target 116. A faster moving velocity results in a lower implant dose in target 116.

The energy at which ions are implanted into target 116 may be approximately equal to the energy of ion beam 106 exiting electrode assembly 112. For example, ion beam 106 may exit electrode assembly 112 at the second energy and then implant ions into target 116 at the second energy.

Controller 120 is coupled to the various components of ion implanting system 100 and controls the ion implanting system 100 to perform the methods and exemplary processes of multi-energy ion implantation into a target as described herein. The function and characteristics of controller 120 will be described later in greater detail.

2. Multi-Energy Ion Implantation Process

Figure 3:
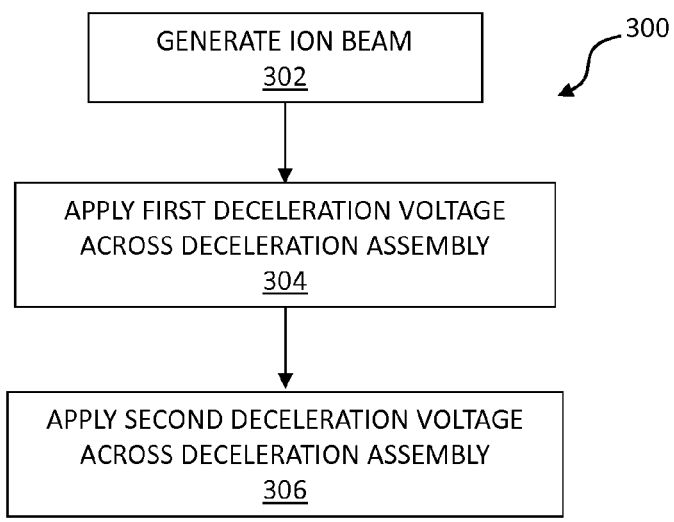
FIG. 3 illustrates an exemplary process for multi-energy ion implantation.

FIG. 3 depicts an exemplary process 300 for multi-energy ion implantation into a target. Process 300 may be performed using any suitable ion implanting system having an ion source, an extraction assembly, and an electrode assembly, such as ion implanting system 100 described in FIG. 1. Additionally, the ion implanting system may optionally include a variable aperture and a holding apparatus. In process 300, the implant energies and implant currents may be adjusted without changing the ion source conditions (e.g., dopant gas flow rate, source magnetic field, arc current) and the extraction assembly conditions (e.g., extraction voltage, extraction electrode positions). The ion source and extraction assembly conditions may therefore be kept constant throughout process 300 where implant energies are controlled by adjusting the voltage applied across the electrode assembly and the implant current is controlled by adjusting the aperture width of the variable aperture. In this way, the ion beam may be kept stable throughout process 300, which obviates the need for long tuning and stabilization times (e.g., 3-10 minutes) each time the ion beam energy and current is adjusted. Therefore, the throughput for process 300 may be significantly higher compared to conventional multi-energy ion implantation processes.

The target may be, for example, a silicon wafer having semiconductor structures formed thereon. In one example, the semiconductor structures may be semiconductor fins for forming fin field effect transistor (FINFET) devices. Process 300 may enable the uniform doping of the semiconductor fins to achieve desirable electrical characteristics in the FINFET devices.

At block 302 of process 300, an ion beam having a first energy and a first current may be generated using the ion source and the extraction assembly of the ion implanting system. As previously explained in FIG. 1, the ion beam may be generated by applying an extraction voltage to at least one extraction electrode in the extraction assembly to extract ions from the ion source. First energy may be as high as the highest desired implant energy and the first current may be at least as high as the highest desired implant current required for implanting the target in process 300. In one example, first energy may be between 2 keV and 30 keV and first current may be between 5 mA and 25 mA. In another example, first energy may be between 15 keV and 25 keV and first current may be between 10 mA and 20 mA. In yet another example where the ion beam consists primarily of As+ ion species, the first energy may be 20 keV and the first current may be 15 mA.

At block 304 of process 300, a first voltage may be applied across the electrode assembly where the ion beam enters the electrode assembly at the first energy and exits the electrode assembly at the second energy. In one example, the first voltage may be approximately 0V. In such an example, the ion beam may pass through the electrode assembly without accelerating or decelerating where the second energy is approximately equal to the first energy.

In another example, the first voltage may be a positive or a negative voltage having a magnitude greater than 0V to either accelerate or decelerate the ion beam. Typically, a negative voltage is applied to either accelerate an ion beam consisting primarily of negative ion species or to decelerate an ion beam consisting primarily of positive ion species. Conversely, a positive voltage is typically applied to either decelerate an ion beam consisting primarily of negative ion species or to accelerate an ion beam consisting primarily of positive ion species. In one example, the magnitude of the first voltage may be between 0 kV and 30 kV. In another example, the magnitude of the first voltage may be between 10 kV and 20 kV. While applying the first voltage, the ion beam may enter the electrode assembly at approximately the first energy, accelerate or decelerate in the electrode assembly, and exit the electrode assembly at a second energy. The second energy may be different from the first energy. The accelerated or decelerated ion beam may then be directed to the target and implant ions into the target at the second energy. In one example, the second energy may be between 0.05 keV and 30 keV. In another example, the second energy may be between 0.2 keV and 10 keV. In an example where the applied first voltage decelerates the ion beam, the second energy is lower than the first energy. In one such example, the ion beam may consist primarily of As+ ion species, the first voltage may be −15 kV, the first energy may be 20 keV, and the second energy may be 5 keV. In an example where the applied first voltage accelerates the ion beam in the electrode assembly, the second energy is higher than the first energy. In one such example, the ion beam may consist primarily of As+ ion species, the first voltage may be +10 kV, the first energy may be 20 keV, and the second energy may be 30 keV.

In one example, the applied first voltage may be such that the ion beam exiting the electrode assembly has an ion beam current that is not suitable to achieve the desired implant dose in the target. In such an example, the variable aperture may be controlled to adjust the ion beam current in order to achieve the desired implant dose. The variable aperture may be set to a first aperture width to achieve the desired ion beam current. For example, the first aperture width may be between 0.1 mm and 100 mm. The first aperture width may be sufficient to achieve an ion beam current where ions are implanted into the target at a second current. In one example, the first aperture width may be such that the ion beam current reduces when the ion beam passes through the variable aperture. In one such example, the ion beam may exit the variable aperture having a current lower than the first current. In another example, the first aperture width may be such that the ion beam current is unchanged when the ion beam passes through the variable aperture. The second current may be lower than the first current. In one example, the second current may be between 0.001 mA and 40 mA. In another example, the second current may be between 5 mA and 15 mA while the first current may be between 5 mA and 25 mA.

Additionally, the moving velocity of the target may be controlled during implanting to achieve the required implant dose in the target. The moving velocity of the target may be adjusted by controlling the translational movement of the holding apparatus. In one example, the moving velocity of the target may be set to a first velocity while the ion beam implants ions into the target at the second energy. The first velocity may be sufficient to achieve the required implant dose in the target. The first moving velocity may be between 10 mm/s and 2000 mm/s.

At block 306 of process 300, a second voltage may be applied across the electrode assembly to accelerate or decelerate the ion beam. The second voltage may be 0V. Alternatively, the second voltage may be a non-zero positive voltage, or negative voltage. The second voltage may be different from the first voltage. In one example, the magnitude of the second voltage may be between 0 kV and 30 kV. In another example, the magnitude of the second voltage may be between 10 kV and 20 kV. While applying the second voltage, the ion beam may enter the electrode assembly at approximately the first energy and exit the electrode assembly at a third energy. The ion beam may then be directed to the target and implants ions into the target at the third energy. In the example where the second voltage is 0V, the third energy is approximately equal to the first energy. In the example where the applied second voltage accelerates the ion beam through the electrode assembly, the third energy is greater than the first energy. In the example where the applied second voltage decelerates the ion beam through the electrode assembly, the third energy is lower than the first energy. The third energy may be different from the second energy. For example, the third energy may be higher or lower than the second energy. In one example, third energy may be between 0.05 keV and 30 keV. In another example, third energy may be between 0.2 keV and 10 keV. In yet another example, the ion beam may comprise As+ ion species, the second voltage may be −19 kV, the first energy may be 20 keV, and the third energy may be 1 keV.

In one example, the applied second voltage may be such that the ion beam exiting the electrode assembly has an ion beam current that is not suitable to achieve the desired implant dose in the target. In such an example, the variable aperture may be controlled to adjust the ion beam current in order to achieve the desired implant dose. The variable aperture may be set to a second aperture width to achieve the desired ion beam current. For example, the second aperture width may be between 0.1 mm and 100 mm. The second aperture width may be different from the first aperture width. The second aperture width may be sufficient to achieve an ion beam current where ions are implanted into the target at a third current. In one example, the second aperture width may be such that the ion beam current reduces when the ion beam passes through the variable aperture. In one such example, the ion beam may exit the variable aperture having a current lower than the first current. In another example, the second aperture width may be such that the ion beam current is unchanged when the ion beam passes through the variable aperture. The third current may be lower than the first current. Additionally, the third current may be different from the second current. In one example, the third current may be between 0.001 mA and 40 mA. In another example, the third current may be between 0.2 mA and 5 mA while the first current may be between 5 mA and 25 mA.

Additionally, the moving velocity of the target may also be controlled during implanting to achieve the required implant dose in the target. The moving velocity of the target may be adjusted by controlling the translational movement of the holding apparatus. In one example, the moving velocity of the target may be set to a second velocity while the ion beam implants ions into the target at the third energy. With given ion beam current, the second velocity may be sufficient to achieve the required implant dose in the target at a predefined scan number (how many times the wafer moves across the ion beam). The second moving velocity may be different from the first moving velocity. The second moving velocity may be between 50 mm/s and 1000 mm/s.

It should be appreciated that process 300 may include additional ion implants (not shown) performed at different implant energies. For example, a third voltage may be applied across the electrode assembly to accelerate or decelerate the ion beam. The ion beam may enter the electrode assembly at approximately the first energy, accelerate or decelerate in the electrode assembly, and exit the electrode assembly at a fourth energy. The ion beam exiting the electrode assembly may then implant ions into the target at the fourth energy. The fourth energy may be different from the third energy.

As previously described, the implant energy in process 300 may be controlled by only adjusting the voltage while keeping the ion source and extraction assembly conditions constant. For example, the ion source and extraction assembly conditions in blocks 304 and 306 may be kept at the same conditions as in block 302 of generating the ion beam. In this way, the ion beam remains stable. Thus, unlike conventional processes, changing the ion beam energy does not require several minutes to re-tune the ion beam and wait for it to stabilize. Rather, the ion beam energy many be change quickly where the ion beam may implant ions into the target shortly (e.g., <10 seconds or <30 seconds) after changing the ion beam energy. For example, block 306 may be performed subsequent to block 304 where the voltage applied across the electrode assembly is changed from the first voltage in block 304 to the second voltage in block 306. As a result, the energy of the ion beam exiting the electrode assembly changes from the second energy in block 304 to the third energy in block 306. The second voltage in block 306 may be applied immediately (e.g., within 1 second) after implanting of the target at the second energy is completed in block 304. The target may then be implanted at the third energy in block 306 within 5-30 seconds of applying the second voltage. Thus process 300 allows for greater throughput compared to conventional multi-energy ion implantation processes.

Additionally, because the target may be implanted shortly after changing the ion beam energy, it obviates the need to implant each target (e.g., semiconductor wafer) in a production lot at one energy before changing the ion beam to the next energy. The target thus does not need to be removed from the ion implanting system between each implant. In one example, the target may be disposed on a holding apparatus in the ion implanting system during process 300. The target may remain on the holding apparatus during and between each implant. For example, the target may remain on the holding apparatus during and between blocks 304 and 306 of implanting at the second energy and at the third energy. This reduces target handling times and thus allows for greater throughput.

As previous described in FIG. 2, the electrode assembly used in process 300 may be configured to deflect the ion beam and thus reduce energy contamination. In one example, the ion beam may be deflected in the electrode assembly in blocks 304 and 306 such that the decelerated ion beam exits the electrode assembly having an energy contamination of less than 0.05%.

3. Computer Implementation

Referring back to FIG. 1, ion implanting system 100 may have a controller 120. Controller 120 is coupled to the various components and controls the ion implanting system 100 to perform the methods and exemplary processes described herein. For example, controller 120 may control the conditions of ion source 102 and extraction assembly 104 to generate ion beam 106 having a first energy and a first current. Controller 120 may control a variable power source (not shown) to apply a voltage across electrode assembly 112. Controller 120 may also control the aperture width of variable aperture 110 to control the ion beam current. Additionally, controller 120 may control the rotational and translational movement of holding apparatus 118 to position target 116 in ion beam 106 such that ion beam 106 is incident to the implantation surface of target 116 and implants ions into target 116. Controller 120 may also control the rotational and translational movement of holding apparatus 118 to control the moving velocity of target 116.

Controller 120 may be one of any form of general purpose data processing system that can be used for controlling the various components of ion implanting system 100. Generally, controller 120 may include a processor 122 in communication with a main memory 124, a storage medium 126, and supporting devices 128 through a bus 130. Processor 122 may be one or more general-purpose processing devices such as a microprocessor, a central processing unit (CPU), or the like. Main memory 124 may be random access memory (RAM) or any other dynamic memory for transient storage of information and instructions to be executed by processor 122. Storage medium 126 may include any non-transitory computer-readable storage medium capable of storing computer software, instructions, or data, such as, but not limited to a hard disk, a floppy disk, a magnetic tape, an optical disk, read only memory (ROM) or other removable or fixed media. The supporting devices 128 may include input/output interfaces or communication interfaces such as USB ports, network interface, Ethernet, PCMCIA slot, etc.). The supporting devices 128 may allow computer programs, software, data, or other instructions to be loaded into controller 120 and be provided to processor 122 for execution.

Non-transitory computer-readable storage medium, such as, storage medium 126, or any other suitable media internal or external to controller 120 may contain computer executable instructions (generally referred to as "computer program code" which may be grouped in the form of computer programs or other groupings) for performing any one or more features or functions of the processes of multi-energy ion implantation described herein. One or more of such computer executable instruction, when provided to processor 122 for execution, may cause the controller 120 to control ion implanting system 100 to perform any one or more features or functions of the multi-energy ion implantation processes described herein.

While specific components, configurations, features, and functions are provided above, it will be appreciated by one of ordinary skill in the art that other variations may be used. Additionally, although a feature may appear to be described in connection with a particular embodiment, one skilled in the art would recognize that various features of the described embodiments may be combined. Moreover, aspects described in connection with an embodiment may stand alone.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A method for multi-energy ion implantation into a target using an ion implanting system, the ion implanting system having an ion source, an extraction assembly, and an electrode assembly, the method comprising:
   generating an ion beam using the ion source and the extraction assembly, wherein the ion source operates under a set of ion source conditions and the extraction assembly operates under a set of extraction assembly conditions to generate the ion beam;
   applying a first voltage across the electrode assembly, wherein the ion beam exits the electrode assembly at a first energy;
   positioning the target in the ion beam to implant ions into the target at the first energy, wherein the ion source operates under the set of ion source conditions and the extraction assembly operates under the set extraction conditions while the first voltage is applied across the electrode assembly and while ions are implanted into the target at the first energy;
   applying a second voltage across the electrode assembly, wherein the ion beam exits the electrode assembly at a second energy that is different from the first energy; and
   positioning the target in the ion beam to implant ions into the target at the second energy, wherein the ion source operates under the set of ion source conditions and the extraction assembly operates under the set of extraction conditions while the second voltage is applied across the electrode assembly and while ions are implanted into the target at the second energy.

2. The method of claim 1, wherein the first voltage is approximately zero, and wherein the ion beam enters the electrode assembly at the first energy and passes through the electrode assembly before exiting the electrode assembly at the first energy.

3. The method of claim 1, wherein the first voltage is applied across the electrode assembly such that the ion beam accelerates as the ion beam passes through the electrode assembly before exiting the electrode assembly at the first energy.

4. The method of claim 1, wherein the first voltage is applied across the electrode assembly such that the ion beam decelerates as the ion beam passes through the electrode assembly before exiting the electrode assembly at the first energy.

5. The method of claim 1, wherein the second energy is lower than the first energy.

6. The method of claim 1, wherein the second energy is higher than the first energy.

7. The method of claim 1, wherein the target is positioned in the ion beam to implant ions into the target at the second energy within 30 seconds after the second voltage is applied across the electrode assembly.

8. The method of claim 1, further comprising:
applying a third voltage across the electrode assembly, wherein the ion beam exits the electrode assembly at a third energy that is different from the second energy and the first energy; and
positioning the target in the ion beam to implant ions into the target at the third energy, wherein the ion source operates under the set of ion source conditions and the extraction assembly operates under the set extraction conditions while the third voltage is applied across the electrode assembly and while ions are implanted into the target at the third energy.

9. The method of claim 1, wherein the target is disposed on a holding apparatus of the ion implanting system, and wherein the target remains on the holding apparatus during and between positioning the target in the ion beam to implant ions into the target at the first energy and positioning the target in the ion beam to implant ions into the target at the second energy.

10. The method of claim 1, wherein positioning the target in the ion beam to implant ions into the target at the first energy includes translating the target at a first velocity with respect to the ion beam, wherein positioning the target in the ion beam to implant ions into the target at the second energy includes translating the target at a second velocity with respect to the ion beam, and wherein the first velocity is different from the second velocity.

11. The method of claim 1, wherein the ion implanting system includes a variable aperture, and further comprising:
controlling an aperture width of the variable aperture such that the ion beam implants ions into the target at a first current while the target is positioned in the ion beam to implant ions into the target at the first energy; and
controlling the aperture width of the variable aperture such that the ion beam implants ions into the target at a second current while the target is positioned in the ion beam to implant ions into the target at the second energy, and wherein the second current is different from the first current.

12. A non-transitory computer-readable storage medium containing computer executable instructions for multi-energy ion implantation into a target using an ion implanting system, the ion implanting system having an ion source, an extraction assembly, and an electrode assembly, the computer executable instructions comprising instructions for:
generating an ion beam using the ion source and the extraction assembly, wherein the ion source operates under a set of ion source conditions and the extraction assembly operates under a set of extraction assembly conditions to generate the ion beam;
applying a first voltage across the electrode assembly, wherein the ion beam exits the electrode assembly at a first energy;
positioning the target in the ion beam to implant ions into the target at the first energy, wherein the ion source operates under the set of ion source conditions and the extraction assembly operates under the set extraction conditions while the first voltage is applied across the electrode assembly and while ions are implanted into the target at the first energy;
applying a second voltage across the electrode assembly, wherein the ion beam exits the electrode assembly at a second energy that is different from the first energy; and
positioning the target in the ion beam to implant ions into the target at the second energy, wherein the ion source operates under the set of ion source conditions and the extraction assembly operates under the set of extraction conditions while the second voltage is applied across the electrode assembly and while ions are implanted into the target at the second energy.

13. The non-transitory computer-readable storage medium of claim 12, wherein the target is positioned in the ion beam to implant ions into the target at the second energy within 30 seconds after the second voltage is applied across the electrode assembly.

14. The non-transitory computer-readable storage medium of claim 12, wherein positioning the target in the ion beam to implant ions into the target at the first energy includes translating the target at a first velocity with respect to the ion beam, wherein positioning the target in the ion beam to implant ions into the target at the second energy includes translating the target at a second velocity with respect to the ion beam, and wherein the first velocity is different from the second velocity.

15. The non-transitory computer-readable storage medium of claim 12, wherein the ion implanting system includes a variable aperture, and wherein the computer executable instructions further comprise instructions for:
controlling an aperture width of the variable aperture such that the ion beam implants ions into the target at a first current while the target is positioned in the ion beam to implant ions into the target at the first energy; and
controlling the aperture width of the variable aperture such that the ion beam implants ions into the target at a second current while the target is positioned in the ion beam to implant ions into the target at the second energy, and wherein the second current is different from the first current.

16. The non-transitory computer-readable storage medium of claim 12, wherein the computer executable instructions further comprise instructions for:
deflecting the ion beam as the ion beam travels through the electrode assembly before exiting the electrode assembly at the first energy.

17. The method of claim 1, wherein the ion beam travels through the electrode assembly prior to exiting the electrode assembly at the first energy or the second energy, and wherein the ion beam is deflected as the ion beam travels through the electrode assembly.

18. The method of claim 17, wherein the ion beam is deflected along an S-shaped path as the ion beam travels through the electrode assembly.

19. The method of claim 17, wherein the ion beam exits the electrode assembly having an energy contamination of less than 0.05%.

20. The method of claim 1, wherein:
the target includes a fin field effect transistor device at least partially formed thereon;
the target is positioned in the ion beam to implant ions into the at least partially formed fin field effect transistor device at the first energy; and
the target is positioned in the ion beam to implant ions into the at least partially formed fin field effect transistor device at the second energy.

* * * * *